US012075615B2

(12) United States Patent
Jung et al.

(10) Patent No.: US 12,075,615 B2
(45) Date of Patent: Aug. 27, 2024

(54) SEMICONDUCTOR DEVICE

(71) Applicant: SAMSUNG ELECTRONICS CO., LTD., Suwon-si (KR)

(72) Inventors: Jaehun Jung, Seongnam-si (KR); Suhwan Lim, Hanam-si (KR); Hyeyoung Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 487 days.

(21) Appl. No.: 17/205,563

(22) Filed: Mar. 18, 2021

(65) Prior Publication Data
US 2021/0398998 A1 Dec. 23, 2021

(30) Foreign Application Priority Data

Jun. 22, 2020 (KR) ........................ 10-2020-0075576

(51) Int. Cl.
H01L 27/11556 (2017.01)
G11C 5/06 (2006.01)
(Continued)

(52) U.S. Cl.
CPC ............. H10B 41/27 (2023.02); G11C 5/06 (2013.01); H01L 23/5386 (2013.01); H10B 43/27 (2023.02)

(58) Field of Classification Search
CPC ............. H10B 20/40–50; H10B 41/20; H10B 53/00–20; H10B 43/10–27; H10B 43/40; H10B 43/35; H10B 43/20–27; H10B 51/00–20; H10B 10/00–18; H10B 12/00–50; H10B 12/10; H10B 41/00–27; H10B 43/00–27; H10B 63/84; H10B 63/845; H10B 61/00–22; H10N 50/80; (Continued)

(56) References Cited

U.S. PATENT DOCUMENTS 8,637,913 B2 1/2014 Yoo et al.
8,772,859 B2 7/2014 Higuchi
(Continued)

FOREIGN PATENT DOCUMENTS

KR 20200053067 A 5/2020

OTHER PUBLICATIONS

Office Action for KR 10-2020-0075576 mailed Jun. 27, 2024, 5 pages, no translation.

Primary Examiner — Cuong B Nguyen
Assistant Examiner — Anthony A Pulatov
(74) Attorney, Agent, or Firm — Myers Bigel, P.A.

(57) ABSTRACT

A semiconductor device includes a substrate, a stack structure including interlayer insulating layers and gate electrodes alternately and repeatedly stacked on the substrate in a first direction perpendicular, a channel structure that penetrates the stack structure, a contact plug disposed on the channel structure, and a bit line on the contact plug. The channel structure includes a core pattern, a pad structure on the core pattern, and a channel layer on a side surface of the core pattern and a side surface of the pad structure. The pad structure includes a pad pattern, a first pad layer, and a second pad layer, the first pad layer that is between the channel layer and the pad pattern, and the second pad layer including a first portion between the channel layer and the first pad layer, and a second portion between the first pad layer and the core pattern.

20 Claims, 12 Drawing Sheets

(51) Int. Cl.
*H01L 23/538* (2006.01)
*H01L 27/11582* (2017.01)
*H10B 41/27* (2023.01)
*H10B 43/27* (2023.01)

(58) Field of Classification Search
CPC ........ H10N 50/85; H10N 50/01; H01L 29/82;
H01L 29/516; H01L 29/6684; H01L
29/78391; H01L 2924/1441; H01L
2924/1438; H01L 28/40–92; H01L
2924/1451; H01L 2924/1437; H01L
2924/1436–14369; H01L 27/092–0928;
H01L 23/5386; H01L 21/76877; H01L
25/0657; G11C 11/14–1697; G11C
11/5607; G11C 11/22–2297; G11C
11/5657; G11C 11/41–419; G11C
11/401–4099; G11C 11/5621–5642; G11C
11/5671; G11C 14/0036; G11C 14/0081;
G11C 14/0027; G11C 14/0072; G11C
14/0009–0045; G11C 14/0018; G11C
19/02–10; G11C 19/14; G11C
2211/5615–5616; G11C 16/00–349; G11C
16/0408–0458; G11C 2211/4016; G11C
2216/06–10; G11C 2216/12–30; G11C
16/0466–0475; G11C 16/06–3495; G11C
5/06; H01F 41/303; H01F 41/27; H01F
10/324–3295

See application file for complete search history.

(56) References Cited

U.S. PATENT DOCUMENTS

| | | | |
|---|---|---|---|
| 9,406,690 | B2 | 8/2016 | Pang et al. |
| 9,721,963 | B1* | 8/2017 | Rabkin ................... H01L 29/24 |
| 9,916,901 | B1 | 3/2018 | Saito et al. |
| 10,438,967 | B2 | 10/2019 | Kim |
| 10,756,110 | B1* | 8/2020 | Sharangpani .......... H10B 41/10 |
| 2018/0006055 | A1 | 1/2018 | Kim et al. |
| 2019/0267391 | A1* | 8/2019 | Imai ....................... H10B 43/40 |
| 2020/0020717 | A1 | 1/2020 | Lee et al. |
| 2020/0144284 | A1 | 5/2020 | Choi et al. |
| 2021/0375910 | A1* | 12/2021 | Baraskar ................ H10B 41/10 |

* cited by examiner

SEMICONDUCTOR DEVICE

CROSS-REFERENCE TO RELATED APPLICATION(S)

This application claims the benefit under 35 USC 119(a) of Korean Patent Application No. 10-2020-0075576 filed on Jun. 22, 2020 in the Korean Intellectual Property Office, the entire disclosure of which is incorporated herein by reference for all purposes.

BACKGROUND

The present inventive concept relates to a semiconductor device.

Semiconductor devices may need high-capacity data processing to be retained while the volume thereof is reduced. Accordingly, there is a need to increase the degree of integration of semiconductor elements constituting such a semiconductor device. Accordingly, as a method for improving the degree of integration of a semiconductor device, a semiconductor device having a vertical transistor structure instead of a related art planar transistor structure has been proposed.

SUMMARY

Example embodiments provide a semiconductor device having improved integration and reliability.

According to example embodiments, a semiconductor device includes a substrate, a stack structure including interlayer insulating layers and gate electrodes alternately and repeatedly stacked on the substrate in a first direction perpendicular to an upper surface of the substrate, a channel structure that penetrates the stack structure, a contact plug on the channel structure, and a bit line on the contact plug. The channel structure includes a core pattern, a pad structure on the core pattern, and a channel layer on a side surface of the core pattern and a side surface of the pad structure. The pad structure includes a pad pattern, a first pad layer, and a second pad layer, such that the first pad layer is between the channel layer and the pad pattern, and the second pad layer includes a first portion that is between the channel layer and the first pad layer, and a second portion that is between the first pad layer and the core pattern.

According to example embodiments, a semiconductor device includes a substrate, a stack structure including interlayer insulating layers and gate electrodes alternately and repeatedly stacked on the substrate, and a channel structure that penetrates the stack structure and includes a core pattern, a pad structure on the core pattern, and a channel layer on a side surface of the core pattern and a side surface of the pad structure. A first upper gate electrode of the gate electrodes has a side surface facing the side surface of the pad structure, and the pad structure includes a pad pattern doped with a first impurity and having a first conductivity type, a first pad layer doped with a second impurity, different from the first impurity, and having a second conductivity type, and a second pad layer that is between the first pad layer and the channel layer.

According to example embodiments, a semiconductor device includes a first substrate, circuit devices on the first substrate, a second substrate on the circuit devices, gate electrodes spaced apart from each other in a first direction perpendicular to an upper surface of the second substrate, interlayer insulating layers alternately stacked with the gate electrodes in the first direction, and a channel structure that penetrates the gate electrodes and the interlayer insulating layers, extending vertically on the second substrate, and includes a channel layer. The channel structure further includes a core pattern in an interior of the channel layer and a pad structure on the core pattern, and the pad structure includes a pad pattern having a first conductivity type, a buffer pad between the pad pattern and the channel layer, and a pad layer on the buffer pad, contacting a side surface of the pad pattern, and having a second conductivity type different from the first conductivity type.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
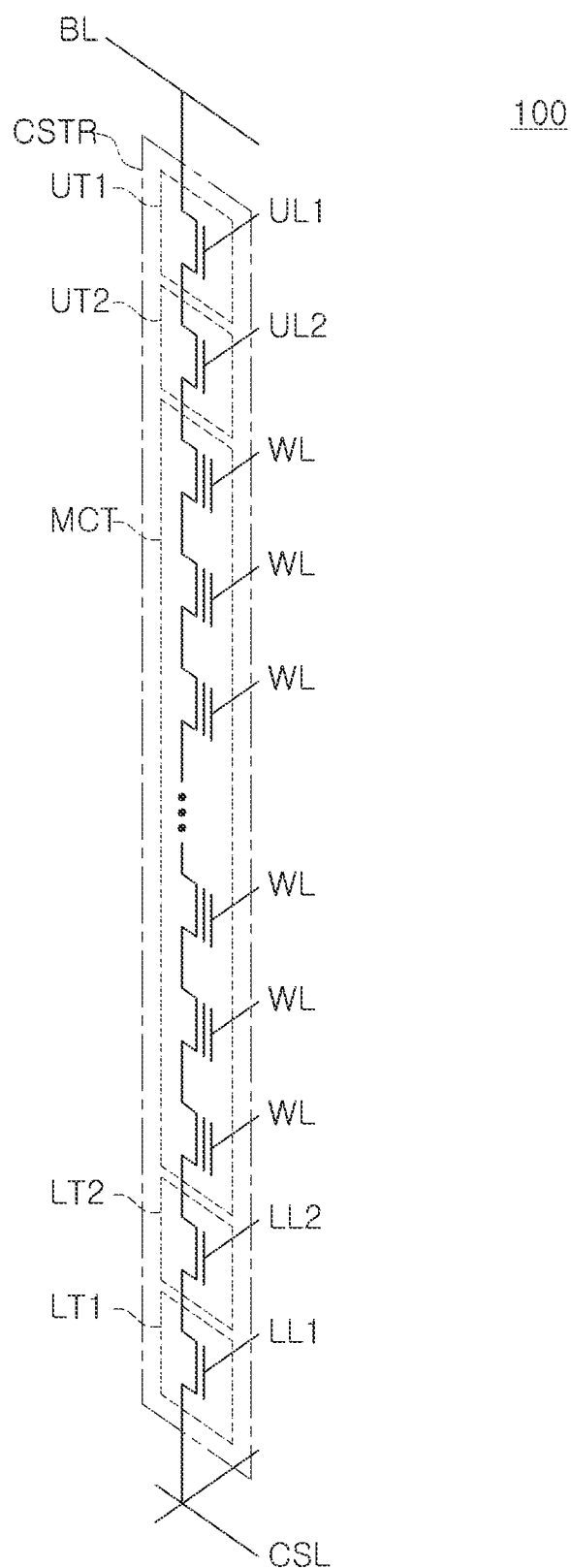
FIG. 1 is a schematic circuit diagram of a semiconductor device according to example embodiments.

FIG. 1 is a schematic circuit diagram of a semiconductor device according to example embodiments.

Referring to FIG. 1, a semiconductor device 100 may include a bit line BL, a common source line CSL, word lines WL, upper gate lines UL1 and UL2, lower gate lines LL1 and LL2, and a cell string CSTR between the bit line BL and the common source line CSL.

The cell string CSTR may include one or a plurality of lower transistors LT1 and LT2 adjacent to the common source line CSL, one or a plurality of upper transistors UT1 and UT2 adjacent to the bit line BL, and/or a plurality of memory cell transistors MCT disposed between the one or the plurality of lower transistors LT1 and LT2 and the one or the plurality of upper transistors UT1 and UT2.

One or a plurality of lower transistors LT1 and LT2, the plurality of memory cell transistors MCT, and one or a plurality of upper transistors UT1 and UT2 may be connected in series.

In example embodiments, one or a plurality of upper transistors UT1 and UT2 may be plural, and the plurality of upper transistors (UT1 and UT2) may include a string select transistor UT2 and an upper erase control transistor UT1 connected in series. The upper erase control transistor UT1 may be disposed on the string select transistor UT2.

The lower gate lines (LL1 and LL2) may include a first lower gate line LL1 and a second lower gate line LL2, and the upper gate lines (UL1 and UL2) may include a first upper gate line UL1 and a second upper gate line UL2.

The first lower gate line LL1 may be a gate electrode of the lower erase transistor LT1, the second lower gate line LL2 may be a gate electrode of the ground select transistor LT1, word lines WL may be gate electrodes of memory cell transistors MCT, the first upper gate line UL1 may be a gate electrode of the upper erase transistor UT1, and the second upper gate line UL2 may be a gate electrode of the string select transistor UT2.

The erase operation for erasing data stored in the memory cell transistors MCT may use a gate induced drain leakage (GIDL) phenomenon occurring in the lower and upper erase transistors LT1 and UT1. During the erase operation, a first voltage, which is an erase voltage, may be applied to the bit line BL, and a second voltage lower than the first voltage may be applied to the erase gate electrode of the first upper gate line UL1. For example, holes generated by a Gate Induced Drain Leakage (GIDL) phenomenon in the lower and upper erase transistors LT1 and UT1 are injected into the channels of the memory cell transistors MCT, and data of the memory cell transistors MCT may be erased by the holes injected into the channels of the memory cell transistors MCT. For example, holes injected into the channels of the memory cell transistors MCT may cause electrons trapped in the information storage layers of the memory cell transistors MCT to escape to the channels of the memory cell transistors MCT.

Figure 2A:
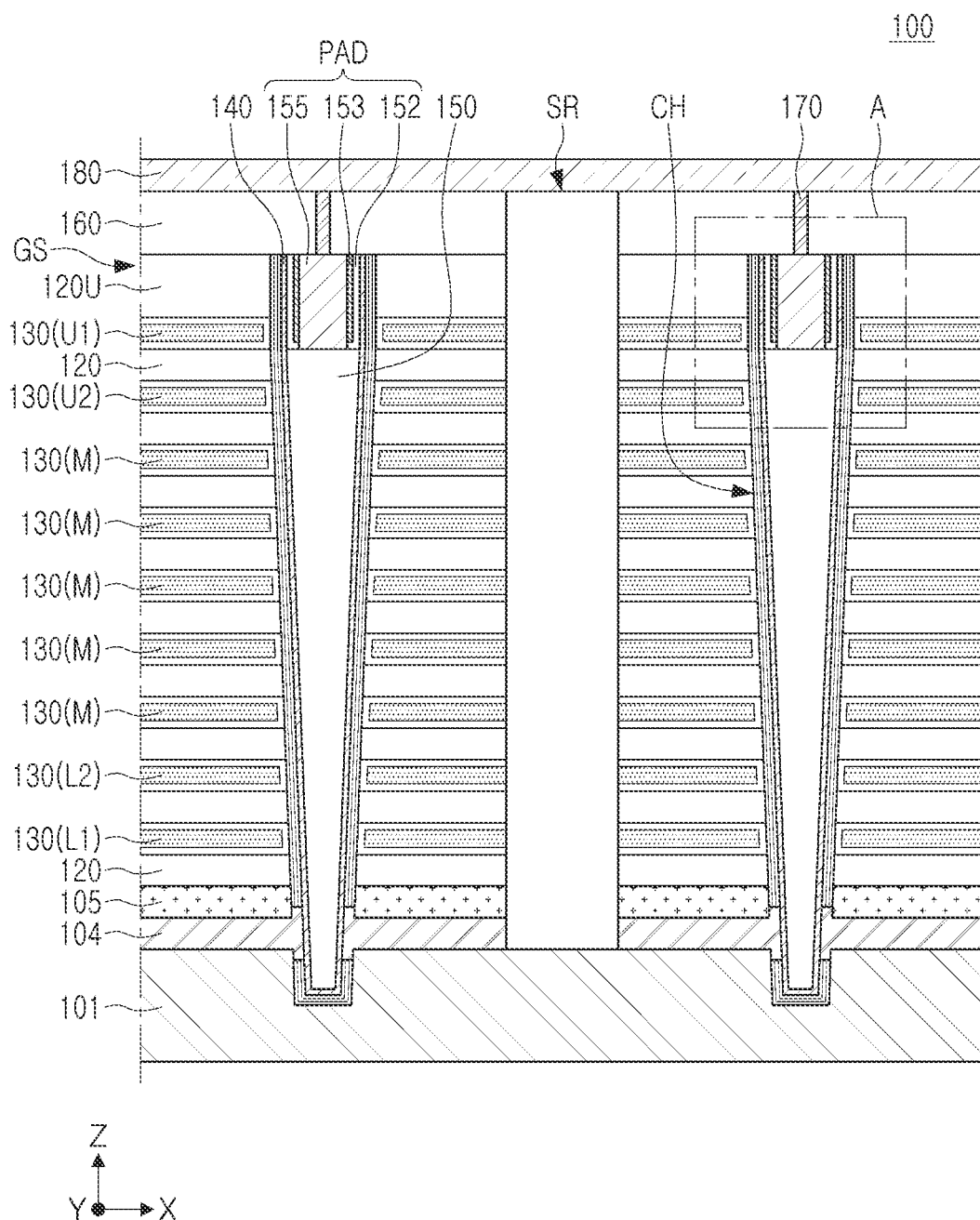
FIG. 2A is a schematic cross-sectional view of a semiconductor device according to example embodiments.

FIG. 2A provides schematic cross-sectional views of semiconductor devices according to example embodiments.

Figure 2B:
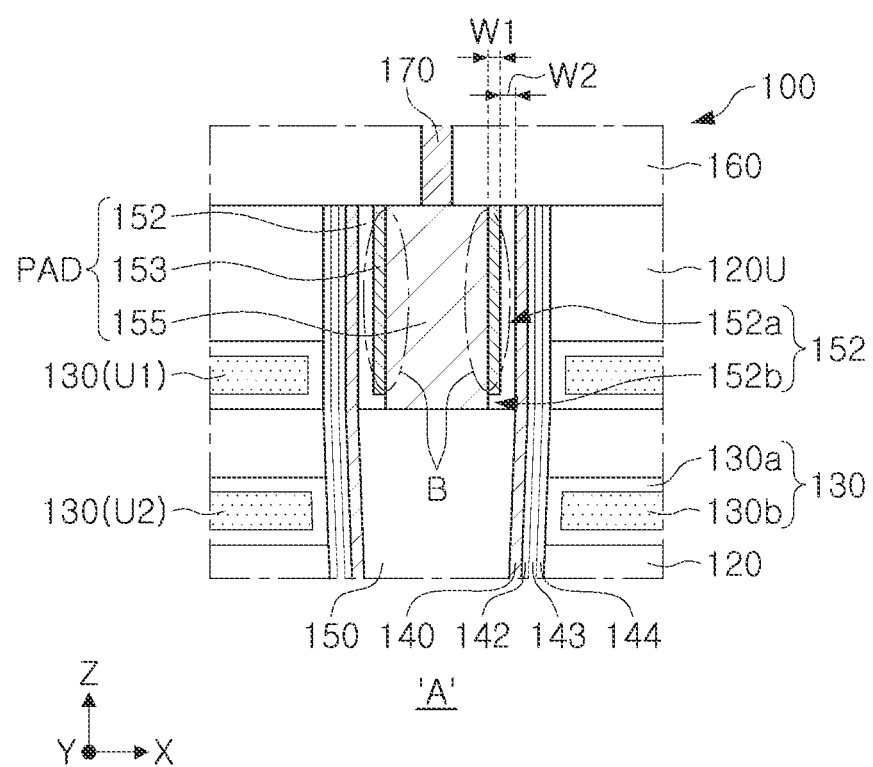
FIG. 2B is a partially enlarged view of a semiconductor device according to example embodiments.

FIG. 2B is a partially enlarged view of a semiconductor device according to example embodiments. FIG. 2B is an enlarged view of area A of FIG. 2A.

Referring to FIGS. 2A and 2B, the semiconductor device 100 may include a substrate 101, a stack structure GS including interlayer insulating layers 120 and gate electrodes 130 alternately stacked in a Z direction, on the substrate 101, channel structures CH penetrating through the stack structure GS, and a separation region SR penetrating through stack structure GS and extending in one direction. The semiconductor device 100 may further include first and second conductive patterns 104 and 105 disposed between the substrate 101 and the stack structure GS. The semiconductor device 100 may further include an upper insulating layer 160, a contact plug 170 electrically connected to the channel structures CH, and a bit line 180 disposed on the contact plug 170 and electrically connected to the contact plug 170.

The substrate 101 may have an upper surface extending in the X and Y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, or a semiconductor-on-insulator (SeOI) layer.

The stack structure GS may include the interlayer insulating layers 120 and the gate electrodes 130 that are alternately and repeatedly stacked in the vertical direction Z. The vertical direction Z may be a direction perpendicular to the upper surface of the substrate 101.

The interlayer insulating layers 120 may include an insulating material such as silicon oxide or silicon nitride. An uppermost interlayer insulating layer 120U of the interlayer insulating layers 120 may have a thickness greater than the thickness of each of the other interlayer insulating layers.

The gate electrodes 130 may be stacked on the substrate 101 to be spaced apart from each other in the vertical direction Z. The gate electrodes 130 may extend by different lengths on at least one region of the substrate 101. The length of gate electrodes 130 that are closer to the substrate may be greater than the length of gate electrodes 130 that are further from the substrate, due to differences in the width of the channel structure CH.

The gate electrodes 130 may include one or a plurality of lower gate electrodes 130(L1) and/or 130(L2), a plurality of intermediate gate electrodes 130(M) disposed on the one or the plurality of lower gate electrodes 130(L1) and 130(L2), and one or a plurality of upper gate electrodes 130(U1) and 130(U2) disposed on the plurality of intermediate gate electrodes 130(M).

The one or the plurality of the lower gate electrodes (130(L1) and 130(L2) may include a first lower gate electrode 130(L1) and a second lower gate electrode 130(L2) on the first lower gate electrode 130(L1). The first and second lower gate electrodes 130(L1) and 130(L2) may correspond to the first and second lower gate lines LL1 and LL2 described with respect to FIG. 1, respectively. The first lower gate electrode 130(L1) is a lower erase gate electrode and may be located at the lowest position among the gate electrodes 130. The first lower gate electrode 130(L1) may overlap a side surface of a core pattern 150. A side surface of the first lower gate electrode 130(L1) may face the side surface of the core pattern 150 and a side surface of the channel layer 140.

The one or the plurality of the upper gate electrodes (130(U1) and 130(U2)) may include a first upper gate electrode 130(U1) and a second upper gate electrode 130(U2). The first upper gate electrode 130(U1) may be disposed on the second upper gate electrode 130(U2). The first upper gate electrode 130(U1) is an upper erase gate electrode and may be positioned as an uppermost layer of the gate electrodes 130. The first and second upper gate electrodes 130(U1) and 130(U2) may correspond to the first and second upper gate lines UL1 and UL2 described with respect to FIG. 1, respectively. In example embodiments, the first upper gate electrode 130(U1) may overlap the pad structure PAD in the horizontal direction X. In example embodiments, a side surface of the first upper gate electrode 130(U1) may face a side surface of the pad structure PAD. In example embodiments, the thickness of the first upper gate electrode 130(U1) may be greater than the thickness of each of the other gate electrodes 130(U2), 130(M), and 130(L) excluding the first upper gate electrode 130(U1).

The intermediate gate electrodes 130(M) may be disposed between the one or the plurality of lower gate electrodes 130(L1) and 130(L2) and the one or the plurality of upper gate electrodes 130(U1) and 130(U2). At least some of the intermediate gate layers 130(M) may correspond to the word lines WL described with respect to FIG. 1. Intermediate gate layers 130M adjacent to one or a plurality of lower gate electrodes 130(L1) and 130(L2) and one or a plurality of upper gate electrodes 130(U1) and 130(U2), among the intermediate gate electrodes 130(M), may be dummy gate electrodes. The number of intermediate gate electrodes 130M may be determined depending on the storage capacity of the semiconductor device 100.

The gate electrodes 130 may be divided and disposed in a predetermined unit by separation regions SR extending in one direction. The gate electrodes 130, between the pair of separation regions SR, may form one memory block, but the range of the memory block is not limited thereto.

Each of the gate electrodes 130 may include a first gate layer 130a and a second gate layer 130b. The first gate layers 130a may include, for example, tungsten nitride (WN), tantalum nitride (TaN), titanium nitride (TiN), or a combination thereof. The second gate layers 130b may include a metal material such as tungsten (W). Depending on example embodiments, the gate electrodes 130 may include polycrystalline silicon or a metal silicide material.

In some embodiments, each of the first gate layers 130a may be formed of a dielectric layer, for example, a high-k dielectric layer, and each of the second gate layers 130b may be formed as a gate electrode. Accordingly, elements indicated by reference numeral 130 in FIG. 2B may be referred to as "gate patterns", and elements indicated by reference numeral 130b may be referred to as "gate electrodes".

The channel structures CH may be spaced apart from each other while forming rows and columns on the substrate 101 in a plan view. The channel structures CH may be disposed to form a grid pattern or may be disposed in a zigzag shape in one direction in a plan view. The channel structures CH may extend vertically on the substrate 101. The channel structures CH may have a columnar shape, and may have inclined side surfaces that become narrower closer to the substrate 101 according to an aspect ratio.

The channel structures CH may include a core pattern 150, a pad structure PAD disposed on the core pattern 150, and a channel layer 140 disposed on a side surface of the core pattern 150 and a side surface of the pad structure PAD.

In the channel structures CH, the channel layer 140 may be formed in an annular shape surrounding the core pattern 150 provided therein, but may have a column shape without the core pattern 150, such as a cylinder or a prism.

In some example embodiments, the channel layer 140 may directly contact the first conductive pattern 104. The channel layer 140 may be electrically connected to the substrate 101 in a lower portion thereof through the first conductive pattern 104.

The channel layer 140 may include a semiconductor material such as polycrystalline silicon, or the like, and the semiconductor material may be an undoped material or a p-type or n-type semiconductor material. The channel structures CH disposed on a straight line in the X direction may be connected to different bit lines 180, respectively, by arrangement of an upper wiring structure and by the contact plug 170 connected to the pad structure PAD. In addition, a portion of the channel structures CH may be a dummy channel that is not connected to the bit line 180.

As illustrated in FIG. 2B, the channel structures CH may include a tunneling layer 142, a charge storage layer 143, and a blocking layer 144 sequentially disposed from the channel layer 140. The relative thicknesses of the tunneling layer 142, the charge storage layer 143, and the blocking layer 144 are not limited to those illustrated in the drawings, and may be changed in various embodiments.

The tunneling layer 142 may include, for example, silicon oxide ($SiO_2$), silicon oxynitride (SiON), or a combination thereof. The charge storage layer 143 may be a charge trap layer and may be formed of silicon nitride. The blocking layer 144 may include silicon oxide ($SiO_2$), silicon oxynitride (SiON), a high-k dielectric material, or a combination thereof.

In the channel structures CH, the tunneling layer 142, the charge storage layer 143, and the blocking layer 144 may be disposed to extend into the substrate 101. The tunneling layer 142, the charge storage layer 143, and the blocking layer 144 may be partially removed from lower ends thereof, and the channel layer 140 may be connected to the first conductive pattern 104 in a region in which the tunneling layer 142, the charge storage layer 143, and the blocking layer 144 have been removed.

The pad structure PAD may be disposed to cover or overlap an upper surface of the core pattern 150 and be electrically connected to the channel layer 140. The pad structure PAD may include a pad pattern 155, a first pad layer 153, and a second pad layer 152. The pad pattern 155 may be disposed on and/or be in direct contact with the core pattern 150. The first pad layer 153 and the second pad layer 152 may be disposed between the channel layer 140 and the pad pattern 155. A first surface corresponding to one side surface of the first pad layer 153 may contact the side surface of the pad pattern 155. A second surface of the first pad layer 153 opposite to the first surface, and a lower surface of the first pad layer 153, may be surrounded by the second pad layer 152. For example, the first pad layer 153 may be disposed on the second pad layer 152. The second pad layer 152 is a buffer pad, and may include a first portion 152a disposed between the channel layer 140 and the first pad layer 153, and a second portion 152b disposed between the first pad layer 153 and the core pattern 150. One side surface of the first portion 152a may contact the first pad layer 153. One side surface of the second portion 152b may contact the pad pattern 155. Other side surfaces of the first portion 152a and the second portion 152b may contact the channel layer 140. The thicknesses of the first portion 152a and the second portion 152b may be substantially the same, but are not limited thereto. In example embodiments, the first portion 152a and the second portion 152b may have different thicknesses. In example embodiments, the second pad layer 152 may have an "L" shape. The first pad layer 153 may extend from the upper insulating layer 160 towards the core pattern 150, but may not extend to contact the core pattern. In other words, the second portion 152b of the second pad layer 152 may be between the first pad layer 153 and the core pattern 150.

A thickness W2 of the second pad layer 152 may be greater than a thickness W1 of the first pad layer 153. In example embodiments, the thickness W1 of the first pad layer 153 may range from about 4.5 nm to about 5.5 nm. In example embodiments, the thickness W2 of the second pad layer 152 may range from about 8 nm to about 15 nm. In some example embodiments, the thickness W2 of the second pad layer 152 may range from about 8 nm to about 9 nm.

The pad pattern 155 may include a semiconductor material such as doped polycrystalline silicon. The pad pattern 155 may be doped with a first impurity to have a first conductivity type. In example embodiments, the first impurity may be a group 5 element of the periodic table of the elements, for example, phosphorus (P) or arsenic (As). Accordingly, the pad pattern 155 may have an N-type conductivity type. In example embodiments, when the pad pattern 155 is doped with phosphorus (P) or arsenic (As), the concentration of phosphorus (P) or arsenic (As) may range from about $2 \times 10^{20}/cm^3$ to about $3 \times 10^{20}/cm^3$.

The first pad layer 153 may include a semiconductor material such as doped polycrystalline silicon. The first pad layer 153 may have a second conductivity type different from the first conductivity type. The first pad layer 153 may be doped with a second impurity, different from the first impurity, to have a second conductivity type. In example embodiments, the second impurity may be a group 3 element of the periodic table of the elements, for example, boron (B) or the like. Accordingly, the first pad layer 153 may have a P-type conductivity type. In example embodiments, when the first pad layer 153 is doped with boron (B), the concentration of boron (B) may range from about $1 \times 10^{20}/cm^3$ to about $1.5 \times 10^{20}/cm^3$.

The second pad layer 152 may include a semiconductor material such as polycrystalline silicon, and the semiconductor material may be an undoped material.

A contact area B may be defined as a portion in which the side surface of the pad pattern 155 having the first conductivity type, and the first surface of the first pad layer 153 having the second conductivity type, contact each other. During the erase operation, since the GIDL phenomenon described with respect to FIG. 1 may be induced in the contact area B of the pad structure PAD, electron-hole pairs may be formed in all of or a portion of the contact area B.

The separation region SR may extend in the vertical direction Z and may penetrate the stack structure GS. The separation region SR may extend in the Y direction. The separation region SR may include an insulating material, for example, silicon oxide.

The first and second conductive patterns 104 and 105 may be stacked and disposed on the upper surface of the substrate 101. At least a portion of the first and second conductive patterns 104 and 105 may function as a common source line of the semiconductor device 100. The first conductive pattern 104 may be disposed around the channel structures CH and may be directly connected to the channel layer 140. The first and second conductive patterns 104 and 105 may include a semiconductor material, for example, polycrystalline silicon. In this case, at least the first conductive pattern 104 may be a doped layer, and the second conductive pattern 105 may be a doped layer or a layer including impurities diffused from the first conductive pattern 104.

The upper insulating layer 160 may be disposed on an uppermost interlayer insulating layer 120U. The upper insulating layer 160 may be formed of an insulating material such as silicon oxide.

The contact plugs 170 penetrate through the upper insulating layer 160 and may be electrically connected to the channel structures CH. For example, the contact plugs 170 may contact the pad patterns 155 of the channel structures CH.

The bit line 180 may be disposed on the upper insulating layer 160. The bit line 180 contacts the contact plugs 170 and may be electrically connected to the channel structures CH through the contact plugs 170. The bit line 180 may correspond to the bit line BL described with respect to FIG. 1.

FIGS. 3 to 7 are partially enlarged views of semiconductor devices according to example embodiments. FIGS. 3 to 7 are enlarged views of an area corresponding to area 'A' of FIG. 2A. In FIGS. 3 to 7, descriptions of the same components as those described with reference to FIGS. 2A and 2B will be omitted, and modified components of the semiconductor device will be described.

Figure 3:
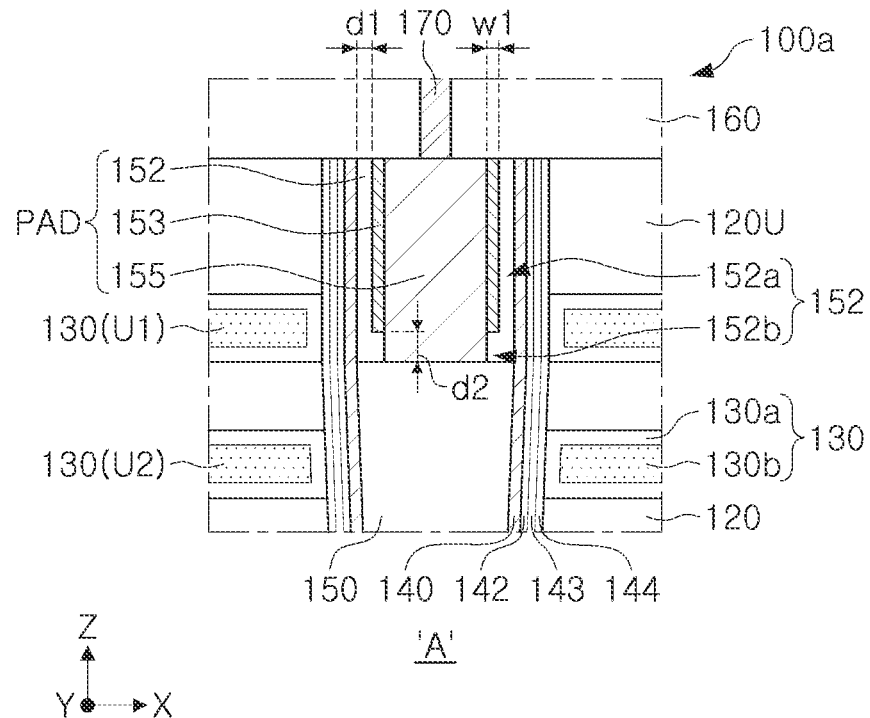
FIGS. 3 to 7 are partially enlarged views of semiconductor devices according to example embodiments.

Referring to FIG. 3, in a semiconductor device 100a, in the case of a second pad layer 152, a thickness of a first portion 152a between the first pad layer 153 and the channel layer 140 and a thickness of a second portion 152b between the first pad layer 153 and the core pattern 150 may be different from each other. A thickness d2 of the second portion 152b in the vertical direction Z may be greater than a thickness d1 of the first portion 152a in the horizontal direction X. In example embodiments, the thickness d2 of the second portion 152b in the vertical direction Z may be greater than a thickness W1 of the first pad layer 153. In example embodiments, the thickness d1 of the first portion 152a in the horizontal direction X may be less than the thickness W1 of the first pad layer 153. In example embodiments, the thickness d2 of the second portion 152b in the vertical direction Z may range from about 8 nm to about 15 nm.

Figure 4:
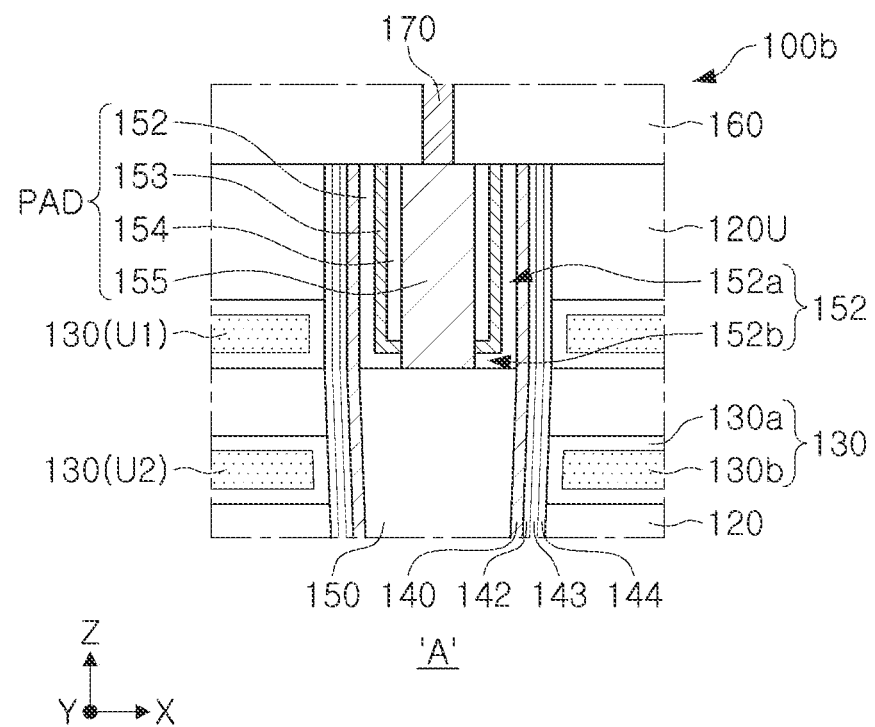

Referring to FIG. 4, a pad structure PAD in the semiconductor device 100b may include a pad pattern 155, a first pad layer 153, a second pad layer 152, and a third pad layer 154.

The pad pattern 155 may be disposed on the core pattern 150. The first pad layer 153, the second pad layer 152, and the third pad layer 154 may be disposed between the pad pattern 155 and the channel layer 140. One side surface of the third pad layer 154 may contact a side surface of the pad pattern 155. The other side surface of the third pad layer 154 and the lower surface of the third pad layer 154 may be surrounded by the first pad layer 153. For example, the third pad layer 154 may be disposed on the first pad layer 153. The first pad layer 153 may be disposed between the third pad layer 154 and the second pad layer 152. The first pad layer 153 may be disposed on the second pad layer 152. In example embodiments, the first pad layer 153 may have an "L" shape. The second pad layer 152 may be disposed between the first pad layer 153 and the channel layer 140. In example embodiments, the second pad layer 152 may have an "L" shape.

The third pad layer 154 may include a semiconductor material such as polycrystalline silicon, and the semiconductor material may be an undoped material. In example embodiments, the third pad layer 154 may be provided as a p-type or n-type semiconductor material by diffusion of impurities in the first pad layer 153 and the pad pattern 155.

Figure 5:
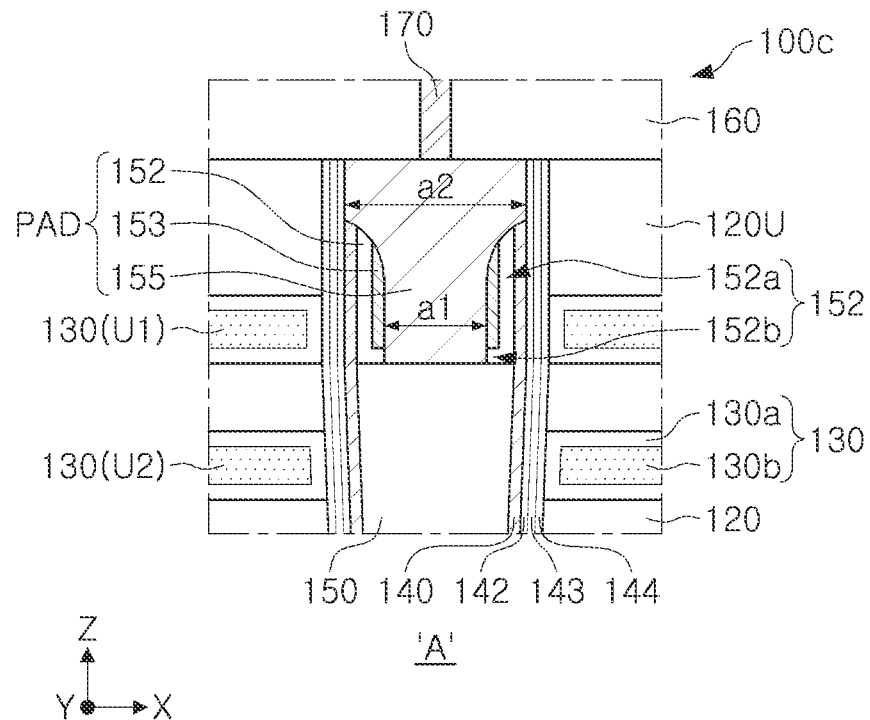

Referring to FIG. 5, in a semiconductor device 100c, a pad structure PAD may include a pad pattern 155 disposed on the core pattern 150, and a pad layer 153 and a second pad layer 152 of which upper surfaces are covered by the pad pattern 155.

The pad pattern 155 may be disposed between the first and second pad layers 152 and 153 which are respectively disposed on both sidewalls thereof, in a lower portion of the pad structure PAD. The pad pattern 155 may cover or overlap upper surfaces of the first and second pad layers 152 and 153, in an upper portion of the pad structure PAD. In example embodiments, in the upper portion of the pad structure PAD, the pad pattern 155 may be in contact with at least one of the tunneling layer 142, the charge storage layer 143, and the blocking layer 144. The pad pattern 155 may cover or overlap an upper surface of the channel layer 140 disposed on an outer sidewall of the pad structure PAD, in an upper portion of the pad structure PAD. The pad pattern 155 may have a first width a1 between the first pad layers 153 disposed on both sidewalls thereof, respectively, in the lower portion of the pad structure PAD, and a second width a2 between the tunneling layers 142 on the outer sidewalls, in the upper portion of the pad structure PAD. The second width a2 may be greater than the first width a1. The pad pattern 155, except for the first and second pad layers 152 and 153, may be disposed on an upper surface of the pad structure PAD, which is in contact with the contact plug 170.

Figure 6:
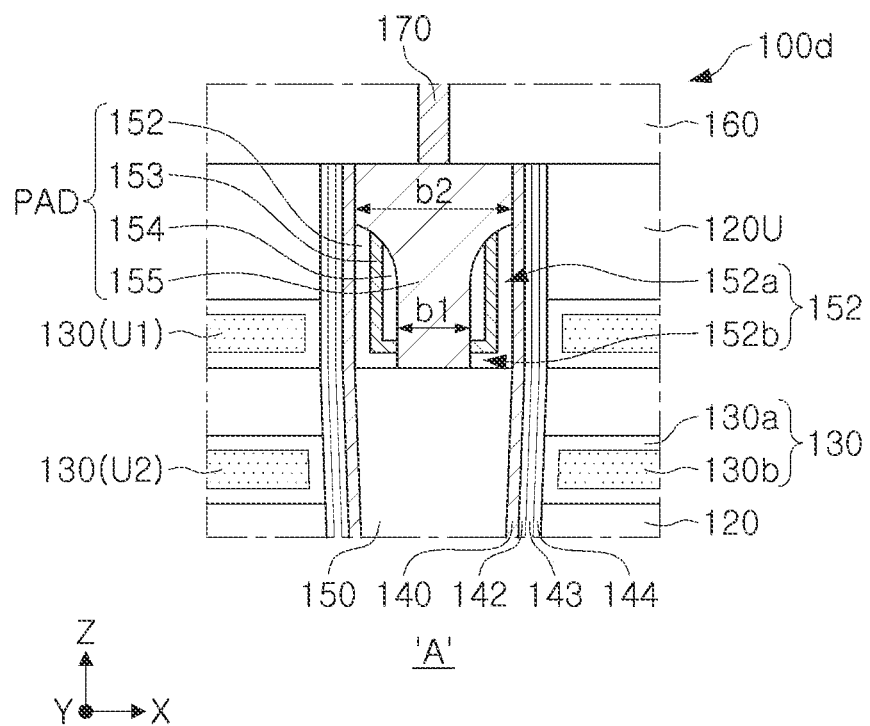

Referring to FIG. 6, in a semiconductor device 100d, a pad structure PAD may include a pad pattern 155 disposed on the core pattern 150, and first to third pad layers 152, 153 and 154 of which upper surfaces are covered or overlapped by the pad pattern 155.

The pad pattern 155 may be disposed between the first to third pad layers 152, 153 and 154 respectively disposed on both sidewalls thereof in a lower portion of the pad structure PAD. The pad pattern 155 may cover or overlap the upper surfaces of the first to third pad layers 152, 153 and 154 in an upper portion of the pad structure PAD. In example embodiments, the pad pattern 155 may be in contact with at least one of a tunneling layer 142, a charge storage layer 143, and a blocking layer 144, in the upper portion of the pad structure PAD. The pad pattern 155 may cover or overlap an upper surface of the channel layer 140 disposed on the outer wall of the pad structure PAD in the upper portion of the pad structure PAD. The pad pattern 155 may have a third width b1 between the third pad layers 154 disposed on both sidewalls, respectively, in the lower portion of the pad structure PAD, and a fourth width b2 between the tunneling layers 142 on the outer walls in the upper portion of the pad structure PAD. The fourth width b2 may be greater than the third width b1. Only the pad pattern 155, except for the first to third pad layers 152, 153 and 154, may be disposed on the upper surface of the pad structure PAD, which is in contact with the contact plug 170.

The first pad layer 153, the second pad layer 152 and the third pad layer 154 may be disposed between the pad pattern 155 and the channel layer 140. One side surface of the third pad layer 154 may contact a side surface of the pad pattern 155. The other side surface of the third pad layer 154 and a lower surface of the third pad layer 154 may be surrounded by the first pad layer 153. For example, the third pad layer 154 may be disposed on the first pad layer 153. The first pad layer 153 may be disposed between the third pad layer 154 and the second pad layer 152. The first pad layer 153 may be disposed on the second pad layer 152. In example embodiments, the first pad layer 153 may have an "L" shape. The second pad layer 152 may be disposed between the first pad layer 153 and the channel layer 140. In example embodiments, the second pad layer 152 may have an "L" shape.

The third pad layer 154 may include a semiconductor material such as polycrystalline silicon, and the semiconductor material may be an undoped material. In example embodiments, the third pad layer 154 may be a p-type or n-type semiconductor material by diffusion of impurities in the first pad layer 153 and the pad pattern 155.

Figure 7:
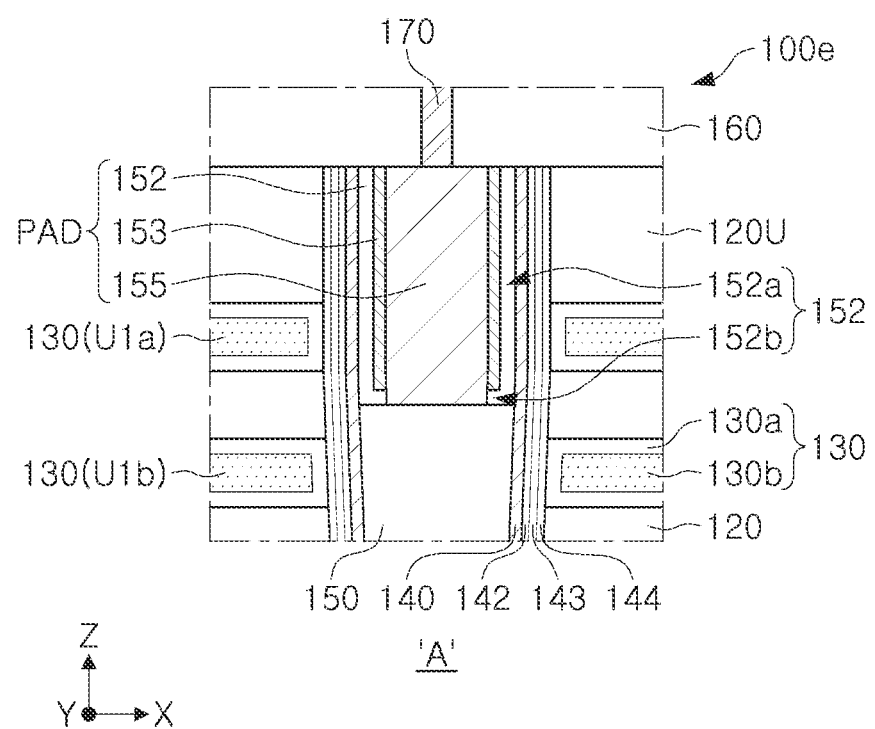

Referring to FIG. 7, in a semiconductor device 100e, gate electrodes 130 may include two or more first upper gate electrodes 130(U1) in an uppermost portion of the gate electrodes 130.

The first upper gate electrode 130(U1) is an erase gate electrode and may include a first erase gate electrode 130(U1a) and a second erase gate electrode 130(U1b). The second erase gate electrode 130(U1b) may be disposed below the first erase gate electrode 130(U1a). The first erase gate electrode 130(U1a) may be disposed as an uppermost layer among the gate electrodes 130. The second erase gate electrode 130(U1b) is adjacent to the first erase gate electrode 130(U1a) in a vertical direction (X), and may be located on a second most upper position among the gate electrodes 130. In example embodiments, the first erase gate electrode 130(U1a) may overlap the pad structure PAD in the horizontal direction X. A side surface of the first erase gate electrode 130(U1a) may face the side surface of the pad structure PAD. In example embodiments, the first erase gate electrode 130(U1a) and the second erase gate electrode 130(U1b) may overlap the pad structure PAD in the horizontal direction X. In example embodiments, side surfaces of the first erase gate electrode 130(U1a) and the second erase gate electrode 130(U1b) may face the side surface of the pad structure PAD. In example embodiments, the lower surface of the pad structure PAD may be located at a height level between the lower surface of the first erase gate electrode 130(U1a) and the upper surface of the second erase gate electrode 130(U1b) with respect to the substrate 101. In example embodiments, a thickness of the first upper gate electrode 130(U1) may be greater than the thickness of the other gate electrodes 130(U2), 130(M) and 130(L), except the first upper gate electrode 130(U1), among the gate electrodes 130. The number of first upper gate electrodes 130(U1) may be variously modified according to example embodiments.

Figure 8:
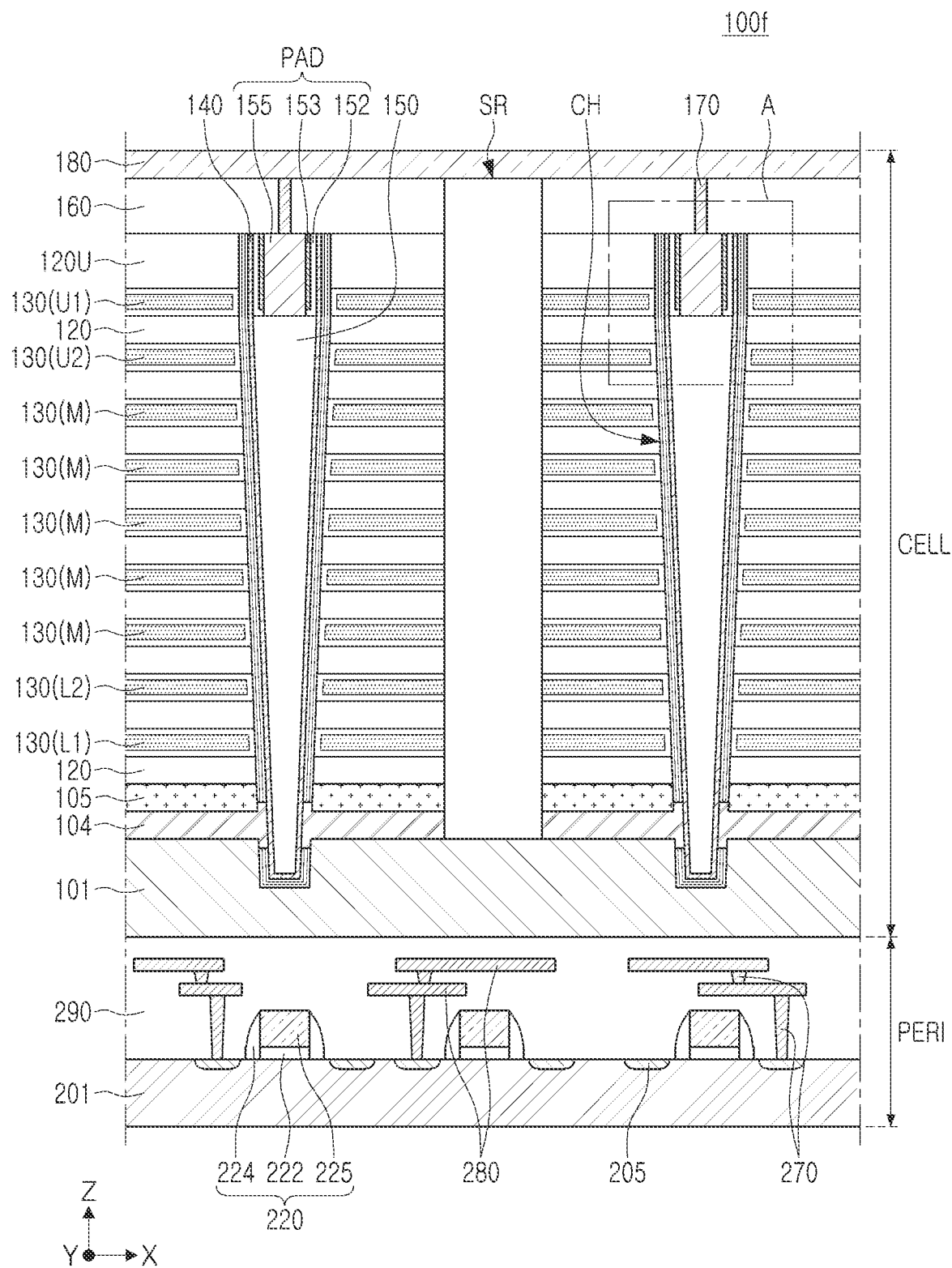
FIG. 8 is a schematic cross-sectional view of a semiconductor device according to example embodiments.

FIG. 8 is a schematic cross-sectional view of a semiconductor device according to example embodiments.

Referring to FIG. 8, a semiconductor device 100f may include a memory cell area CELL and a peripheral circuit area PERI stacked vertically. The memory cell area CELL may be disposed on an upper end portion of the peripheral circuit area PERI. In example embodiments, the memory cell area CELL may also be disposed on a lower end portion of the peripheral circuit area PERI.

The peripheral circuit area PERI may include a base substrate 201, circuit devices 220 disposed on the base substrate 201, circuit contact plugs 270, and circuit wiring lines 280.

The base substrate 201 may have an upper surface extending in the X and Y directions. In the base substrate 201, separate device isolation layers may be formed to define an active region. Source/drain regions 205 including impurities may be disposed in a portion of the active region. The base substrate 201 may include a semiconductor material, such as a group IV semiconductor, a group III-V compound semiconductor, or a group II-VI compound semiconductor.

The circuit devices 220 may include planar transistors. Each of the circuit devices 220 may include a circuit gate dielectric layer 222, a spacer layer 224, and a circuit gate electrode 225. The source/drain regions 205 may be disposed on both sides of the circuit gate electrode 225 in the base substrate 201.

A peripheral area insulating layer 290 may be disposed on the circuit devices 220, on the base substrate 201. Circuit contact plugs 270 may penetrate through the peripheral area insulating layer 290 and may be connected to the source/drain regions 205. An electric signal may be applied to the circuit device 220 by the circuit contact plugs 270. In a region not illustrated, the circuit contact plugs 270 may also be connected to the circuit gate electrodes 225. The circuit wiring lines 280 may be connected to the circuit contact plugs 270 and may be disposed as a plurality of layers.

In a semiconductor device 100f, after the peripheral circuit area PERI is first formed, the substrate 101 of the memory cell area CELL is formed thereon to manufacture the memory cell area CELL. The substrate 101 may have the same size as the base substrate 201 or may be formed to be smaller than the base substrate 201. The memory cell area CELL and the peripheral circuit area PERI may be connected to each other in an area not illustrated. For example, one end of the gate electrode 130 in the Y direction may be electrically connected to the circuit devices 220. As described above, the form in which the memory cell area CELL and the peripheral circuit area PERI are vertically stacked may be applied to the example embodiments of FIGS. 2A to 7. For other configurations, the description described above with reference to FIGS. 1 to 2B may be equally applied.

FIGS. 9A to 9E are schematic cross-sectional views illustrating a method of manufacturing a semiconductor device according to example embodiments.

Figure 9A:
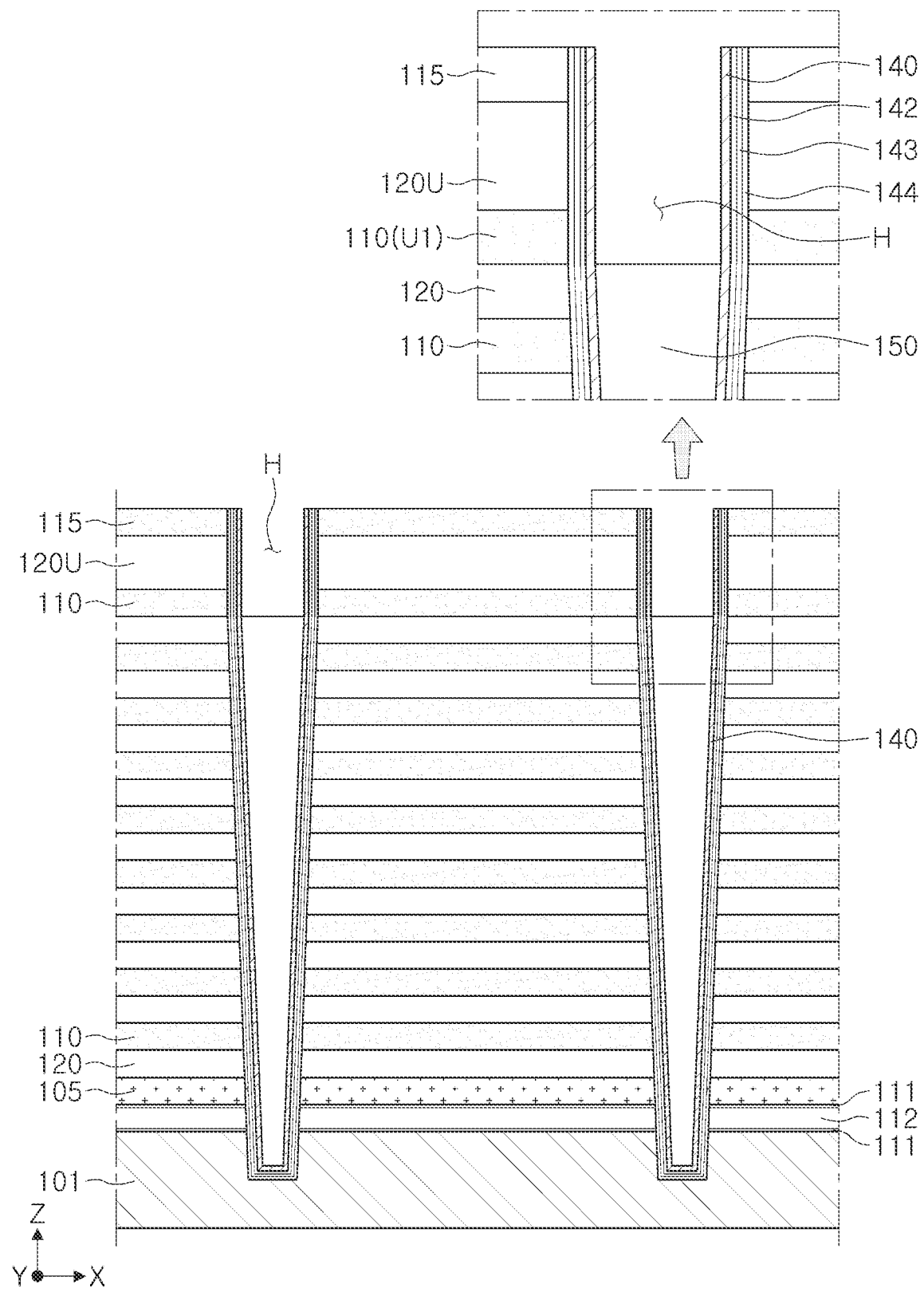
FIGS. 9A to 9E are schematic cross-sectional views illustrating a method of manufacturing a semiconductor device according to example embodiments.

Referring to FIG. 9A, first and second source sacrificial layers 111 and 112 and a second conductive pattern 105 are formed on a substrate 101, and horizontal sacrificial layers 110 and interlayer insulating layers 120 are alternately stacked, thereby forming a stack structure. A channel hole is formed to penetrate through the stack structure, and a blocking layer 144, a charge storage layer 143, a tunneling layer 142, a channel layer 140, and a core pattern 150 are sequentially buried in the channel hole. Thereafter, an upper portion of the core pattern 150 may be partially removed to form a recess region H.

First, the first and second source sacrificial layers 111 and 112 may include different materials, and may be disposed on the substrate 101 in such a manner that the first source sacrificial layers 111 are disposed on and below the second source sacrificial layer 112. The first and second source sacrificial layers 111 and 112 may be layers replaced with the first conductive pattern 104 of FIG. 2A through a subsequent process. For example, the first source sacrificial layer 111 may be formed of the same material as the interlayer insulating layers 120, and the second source sacrificial layer 112 may be formed of the same material as the horizontal sacrificial layers 110. The second conductive pattern 105 may be deposited on the first and second source sacrificial layers 111 and 112.

Next, the stack structure may be formed by alternately stacking the horizontal sacrificial layers 110 and the interlayer insulating layers 120 on the second conductive pattern 105.

The horizontal sacrificial layers 110 may be layers that are replaced with gate electrodes 130 through a subsequent process. The horizontal sacrificial layers 110 may be formed of a material different from that of the interlayer insulating layers 120. For example, the interlayer insulating layer 120 may be formed of silicon oxide, and the horizontal sacrificial layers 110 may be formed of a material selected from silicon, silicon carbide, and silicon nitride, different from the material of the interlayer insulating layer 120. In example embodiments, the thickness of some of the interlayer insulating layers 120 may be different from the thickness of the remaining interlayer insulating layers. For example, a lowermost interlayer insulating layer 120 may be formed relatively thin, and an uppermost interlayer insulating layer 120U may be formed relatively thick. The thickness of and the number of layers constituting the interlayer insulating layers 120 and the horizontal sacrificial layers 110 may be variously changed differently from the illustration in the drawings. A stop layer 115 may be formed on an uppermost layer thereof.

Next, channel holes may be formed in regions corresponding to the channel structures CH of FIG. 2A. The channel holes may be formed by anisotropically etching the stack structure, and may be formed to have a hole shape. Due to the height of the stack structure, sidewalls of the channel holes may not be entirely perpendicular to the upper surface of the substrate 101. The channel holes may be formed to recess a portion of the substrate 101.

A blocking layer 144, a charge storage layer 143, a tunneling layer 142, a channel layer 140, and a core pattern 150 may be sequentially filled in the channel holes. The channel layer 140, the tunneling layer 142, the charge storage layer 143, and the blocking layer 144 may be formed to have a uniform thickness, using an atomic layer deposition (ALD) or chemical vapor deposition (CVD) process. The core pattern 150 is formed to fill the internal space of the channel layer 140 and may be formed of an insulating material.

Next, the recess region H may be formed by partially removing the upper portion of the core pattern 150. A portion of the core pattern 150 may be removed through an etching process. In this case, the degree of etching of the core pattern 150 may be adjusted so that the upper surface of the core pattern 150 overlaps an uppermost horizontal sacrificial layer 110(U1) in the horizontal direction X. For example, the side surface of the recess region H and the side surface of the uppermost horizontal sacrificial layer 110(U1) may face each other.

Figure 9B:
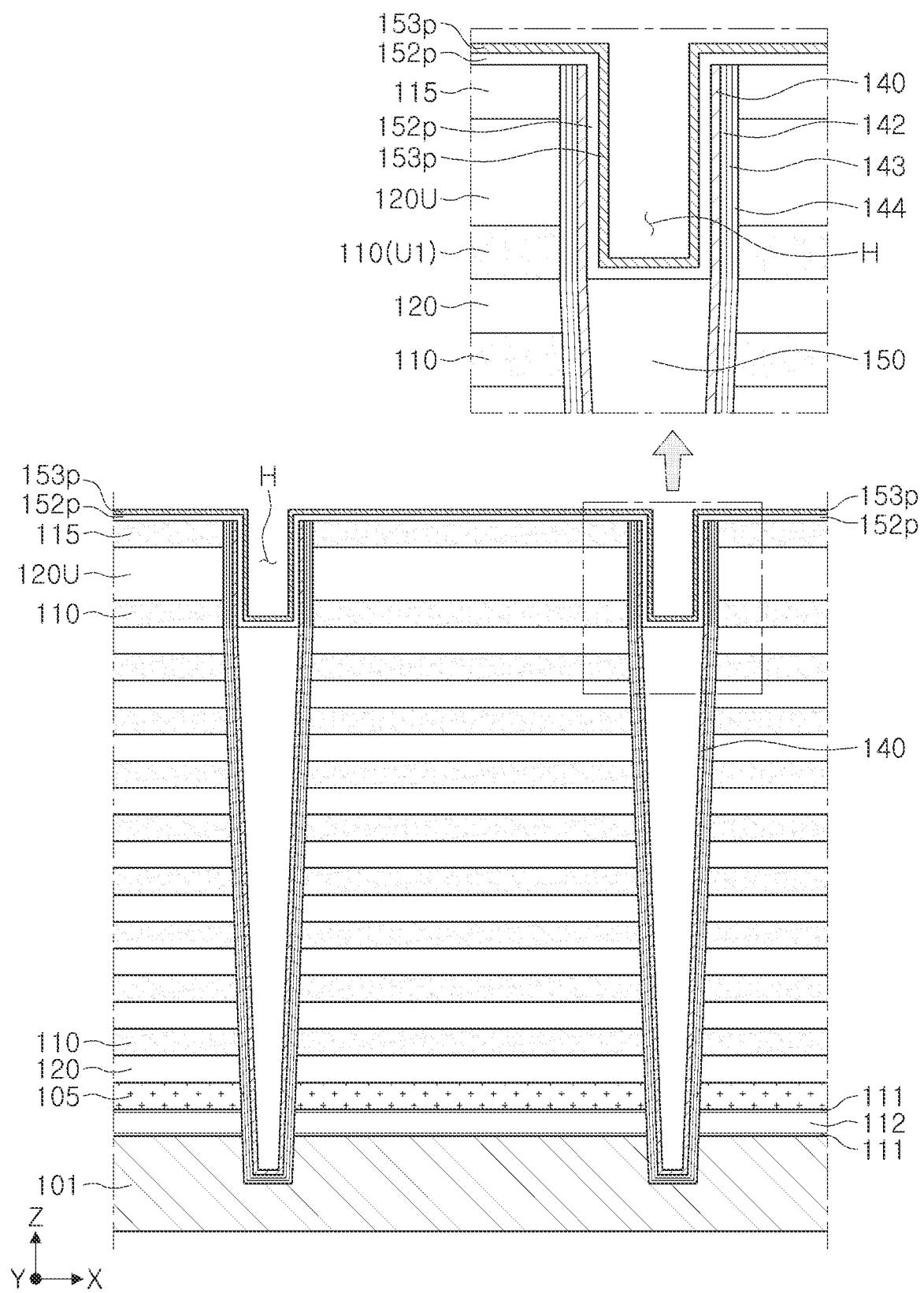

Referring to FIG. 9B, a second preliminary pad layer 152p and a first preliminary pad layer 153p may be sequentially stacked in the recess region H.

The second preliminary pad layer 152p and the first preliminary pad layer 153p may be sequentially deposited along the inner surface of the recess region H. In example embodiments, a thickness of the second preliminary pad layer 152p may be deposited to be greater than a thickness of the first preliminary pad layer 153p. The second preliminary pad layer 152p may include a semiconductor material such as polycrystalline silicon, and the semiconductor material may be an undoped material. In example embodiments, the first preliminary pad layer 153p may be deposited to be thinner than the second preliminary pad layer 152p. The first preliminary pad layer 153p may include a semiconductor material such as polycrystalline silicon, and the semiconductor material may be a p-type semiconductor material, for example, a material including boron (B) or the like. In example embodiments, when boron (B) is doped, the concentration of boron (B) may range from about $1*10^{20}/cm^3$ to about $1.5*10^{20}/cm^3$.

Figure 9C:
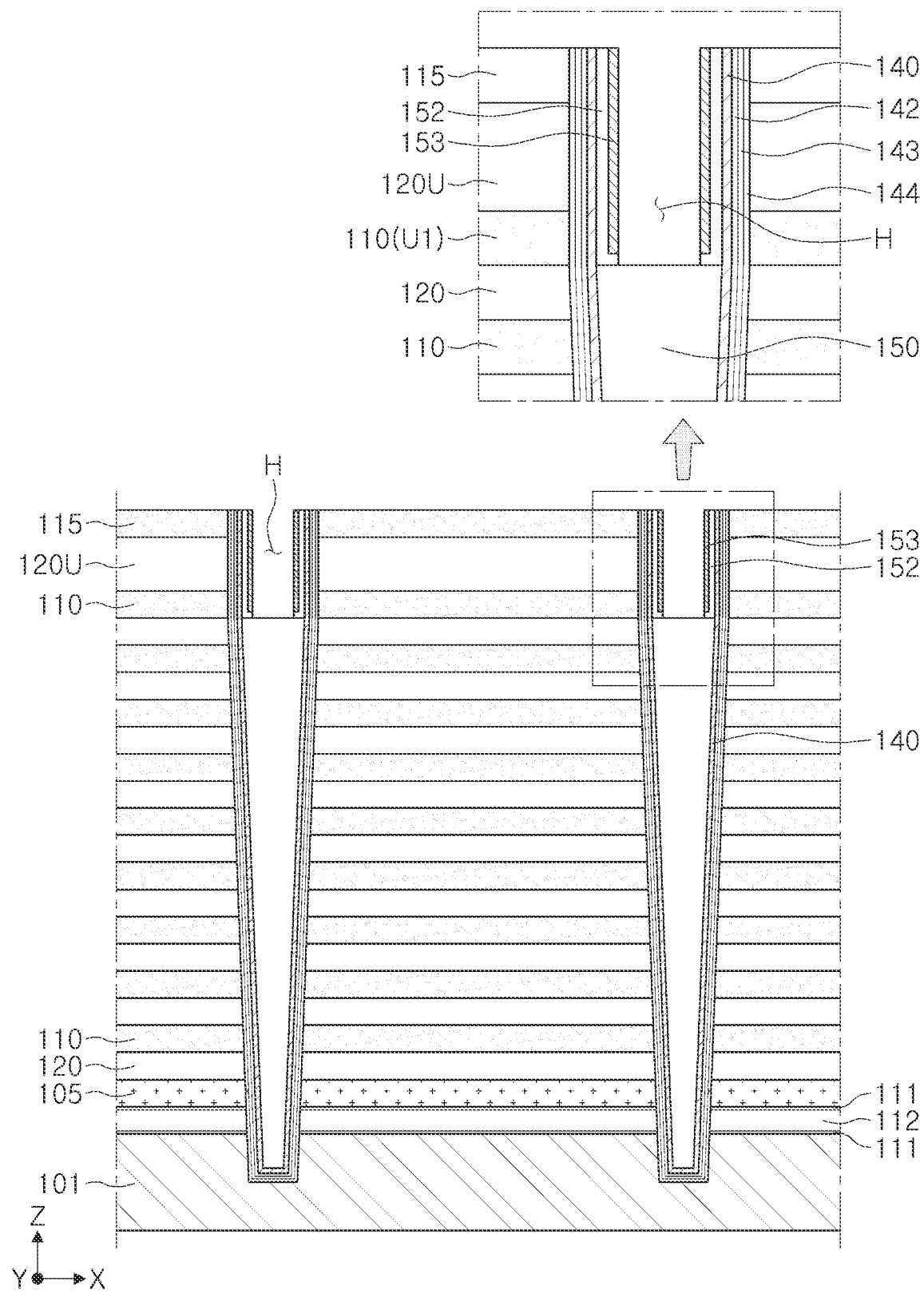

Referring to FIG. 9C, a first pad layer 153 and a second pad layer 152 may be formed by partially removing the first preliminary pad layer 153p and the second preliminary pad layer 152p of FIG. 9B.

The first preliminary pad layer 153p and the second preliminary pad layer 152p disposed on the lower surface of the recess region H may be removed by an etching process, for example, an anisotropic etching process. Portions of the first preliminary pad layer 153p and the second preliminary pad layer 152p may be etched to form the first pad layer 153 and the second pad layer 152, and the upper surface of a core pattern 150 may be exposed to the recess region H.

Figure 9D:
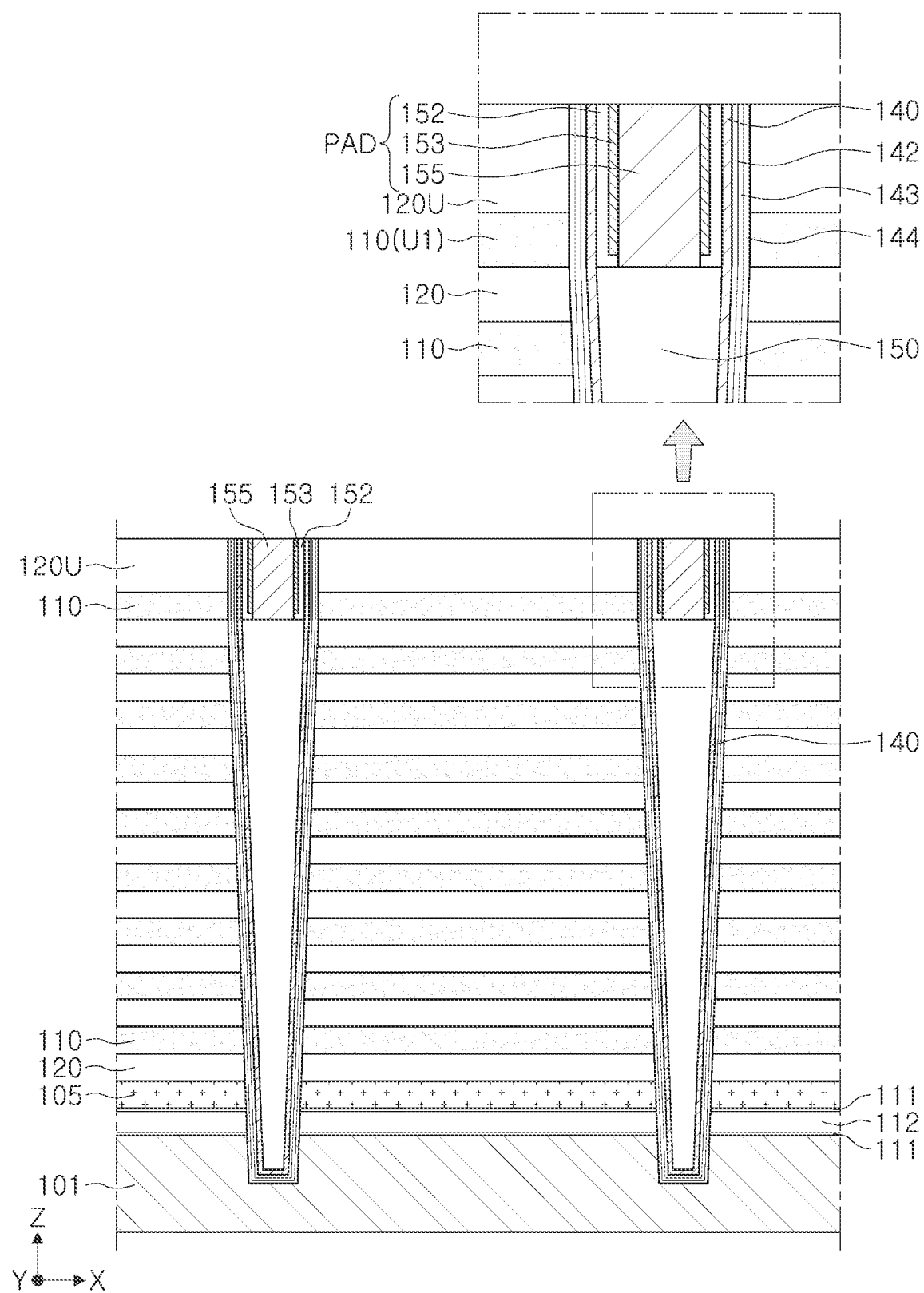

Referring to FIG. 9D, after forming a pad pattern 155 filling the inner space of the first pad layer 153 in the recess region H, a planarization process is performed to obtain a pad pattern PAD including the pad pattern 155, the first pad layer 153 and the second pad layer 152.

The pad pattern 155 may include a semiconductor material such as polycrystalline silicon, and the semiconductor material may be an n-type semiconductor material, for example, a material including phosphorus (P) or arsenic (As). In example embodiments, when phosphorus (P) or arsenic (As) is doped, the concentration of phosphorus (P) or arsenic (As) may range from about $2*10^{20}/cm^3$ to about $3*10^{20}/cm^3$.

In example embodiments, the planarization process may be a chemical mechanical polishing process (CMP). During the planarization process, or after the planarization process, the stop layer 115 of FIG. 9C may be removed.

Figure 9E:
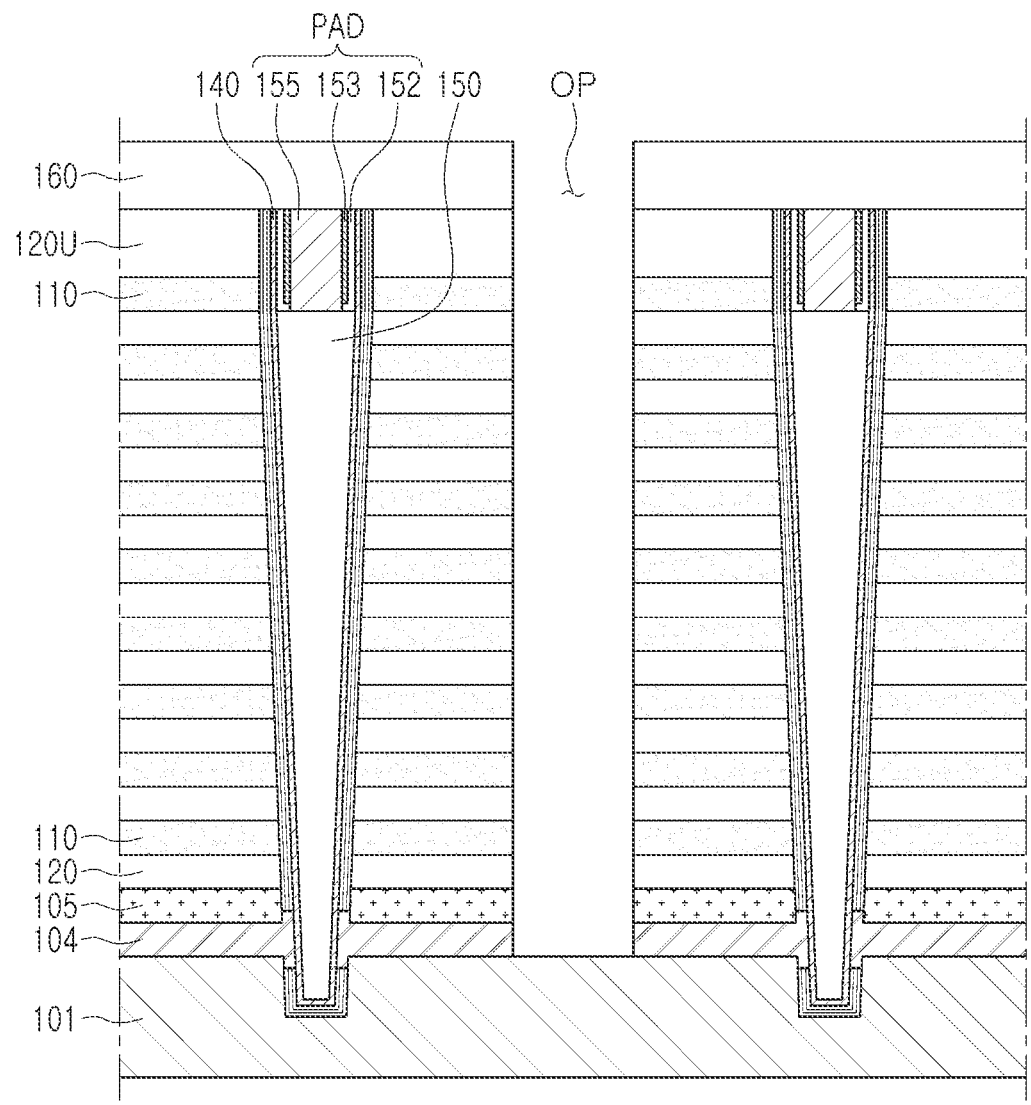

Referring to FIG. 9E, an upper insulating layer 160 may be formed on an uppermost interlayer insulating layer 120U and the channel structure PAD. After an opening OP is formed to divide the upper insulating layer 160 and the stack structure at a predetermined interval and to penetrate through the upper insulating layer 160 and the stack structure, the first and second source sacrificial layers 111 and 112 are removed through the opening OP, and then, the first conductive pattern 104 may be formed.

The opening OP may be formed in a trench shape extending in the Y direction, and may be formed in a region in which the separation region SR of FIG. 2A is disposed.

In example embodiments, before removing the first and second source sacrificial layers 111 and 112, a spacer layer may be formed on a sidewall of the opening OP to protect the horizontal sacrificial layers 110. After the second source sacrificial layer 112 is first removed through the opening OP, the first source sacrificial layers 111 may be removed. The first and second source sacrificial layers 111 and 112 may be removed by, for example, an isotropic etching process. During the removal process of the first source sacrificial layers 111, portions of the tunneling layer 142, the charge storage layer 143, and the second blocking layer 144 of FIG. 2B exposed in the region from which the second source sacrificial layer 112 has been removed may be removed together. After forming the first conductive pattern 104 by depositing a conductive material in the region from which the first and second source sacrificial layers 111 and 112 have been removed, the spacer layer may be removed. The first conductive pattern 104 may directly contact the channel layer 140 in a region from which the tunneling layer 142, the charge storage layer 143, and the second blocking layer 144 have been removed.

Next, referring to FIG. 2A again, after removing the horizontal sacrificial layers 110 exposed through the opening OP, a conductive material fills the region from which the horizontal sacrificial layers 110 have been removed to form the gate electrodes 130, and the separation region SR may be formed by filling the opening OP with an insulating material. Next, contact plugs 170 penetrating through the upper insulating layer 160 and bit lines 180 disposed on the contact plugs may be formed.

After the first conductive pattern 104 is formed, the sacrificial spacer layers may be removed from the openings OP. The gate electrodes 130 may include a metal, polycrystalline silicon, or metal silicide material. After the gate electrodes 130 are formed, the openings OP may be filled with an insulating material to form the separation region SR.

Next, contact plugs 170 may be formed to be electrically connected to the pad structure PAD while penetrating through the upper insulating layer 160. The contact plugs 170 may be formed by etching and removing a portion of the upper insulating layer 160 and filling a conductive material. The bit line 180 may be formed of a conductive material.

As set forth above, in a semiconductor device according to example embodiments, an erase gate electrode disposed on an uppermost portion of the gate electrodes may horizontally overlap a pad structure disposed on channel structures. Since the pad structure includes a pad pattern having an N-type conductivity type and a pad layer having a P-type conductivity type in contact with the pad pattern, the amount of holes generated by a Gate Induced Drain Leakage (GIDL) phenomenon may be increased in an area of contact between the pad pattern and the pad layer when a NAND flash memory device performs an erasing operation. Therefore, holes generated in the contact area between the pad pattern and the pad layer are injected into the channel layer of the channel structure, thereby allowing electrons trapped in an information storage layer of memory cell transistors to escape to the channel layer. Various and beneficial advantages and effects of the present inventive concept are not limited to the above description, and may be more easily understood in the course of describing specific embodiments of the present inventive concept.

While example embodiments have been illustrated and described above, it will be apparent to those skilled in the art that modifications and variations could be made without departing from the scope of the present inventive concept as defined by the claims.

What is claimed is:

1. A semiconductor device comprising:
a substrate;
a stack structure comprising interlayer insulating layers and gate electrodes alternately and repeatedly stacked on the substrate in a first direction perpendicular to an upper surface of the substrate;
a channel structure that penetrates the stack structure;
a contact plug on the channel structure; and
a bit line on the contact plug,
wherein the channel structure comprises a core pattern, a pad structure on the core pattern, and a channel layer on a side surface of the core pattern and a side surface of the pad structure, and
wherein the pad structure comprises a pad pattern, a first pad layer, and a second pad layer,
wherein the first pad layer is between the channel layer and the pad pattern,
wherein the second pad layer comprises a first portion that is between the channel layer and the first pad layer, and a second portion that is between the first pad layer and the core pattern,
wherein the second portion of the second pad layer directly contacts a side surface of the pad pattern, and
wherein a side surface of the first pad layer directly contacts the side surface of the pad pattern.

2. The semiconductor device of claim 1,
wherein the pad pattern has a first conductivity type, and
wherein the first pad layer has a second conductivity type different from the first conductivity type.

3. The semiconductor device of claim 2, wherein the first conductivity type is a N-type conductivity type, and the second conductivity type is a P-type conductivity type.

4. The semiconductor device of claim 1,
wherein a first uppermost gate electrode of the gate electrodes comprises a first erase control gate electrode of an erase control transistor,
wherein the first erase control gate electrode overlaps the pad pattern, the first pad layer, and the second pad layer in a second direction perpendicular to the first direction.

5. The semiconductor device of claim 4, wherein a second uppermost gate electrode of the gate electrodes is adjacent to the first erase control gate electrode of the erase control transistor in the first direction and comprises a second erase control gate electrode.

6. The semiconductor device of claim 5, wherein a lower surface of the pad structure is at a height level between a lower surface of the first erase control gate electrode of the erase control transistor and an upper surface of the second erase control gate electrode with respect to the substrate.

7. The semiconductor device of claim 1, wherein a thickness of the second pad layer is greater than a thickness of the first pad layer.

8. The semiconductor device of claim 1, wherein a thickness of the first pad layer ranges from about 4.5 nm to about 5.5 nm.

9. The semiconductor device of claim 8, wherein a thickness of the second pad layer ranges from about 8 nm to about 15 nm.

10. The semiconductor device of claim 1,
wherein a thickness of the second portion in a second direction perpendicular to the first direction is greater than a thickness of the second portion in the first direction, and
wherein the second portion of the second pad layer contacts the core pattern.

11. The semiconductor device of claim 1, wherein the pad pattern overlaps upper surfaces of the first pad layer, the second pad layer, and the channel layer in the first direction that is perpendicular to the upper surface of the substrate.

12. The semiconductor device of claim 1, wherein the pad structure further comprises a third pad layer that is between the pad pattern and the first pad layer.

13. A semiconductor device comprising:
a substrate;
a stack structure comprising interlayer insulating layers and gate electrodes alternately and repeatedly stacked on the substrate in a first direction perpendicular to an upper surface of the substrate; and
a channel structure that penetrates the stack structure and comprises a core pattern, a pad structure on the core pattern, and a channel layer on a side surface of the core pattern and a side surface of the pad structure,
wherein a first upper gate electrode of the gate electrodes has a side surface facing the side surface of the pad structure,
wherein the pad structure comprises a pad pattern doped with a first impurity and having a first conductivity type, a first pad layer doped with a second impurity different from the first impurity and having a second conductivity type, and a second pad layer that is between the first pad layer and the channel layer, and
wherein the first upper gate electrode of the gate electrodes overlaps the pad pattern, the first pad layer, and the second pad layer in a second direction that is perpendicular to the first direction.

14. The semiconductor device of claim 13, wherein the first conductivity type comprises a N-type conductivity type, and the second conductivity type comprises a P-type conductivity type.

15. The semiconductor device of claim 13,
wherein the second pad layer comprises an L shape, and
wherein the first pad layer is on the second pad layer and contacts a side surface of the pad pattern.

16. The semiconductor device of claim 13, wherein a thickness of the first upper gate electrode of the gate electrodes is greater than a thickness of other ones of the gate electrodes excluding the first upper gate electrode.

17. A semiconductor device comprising:
a first substrate;
circuit devices on the first substrate;
a second substrate on the circuit devices;
gate electrodes spaced apart from each other in a first direction perpendicular to an upper surface of the second substrate;
interlayer insulating layers alternately stacked with the gate electrodes in the first direction; and
a channel structure that penetrates the gate electrodes and the interlayer insulating layers, extends vertically on the second substrate, and comprises a channel layer,
wherein the channel structure further comprises a core pattern in an interior of the channel layer, and a pad structure on the core pattern,
wherein the pad structure comprises a pad pattern having a first conductivity type, a buffer pad between the pad pattern and the channel layer, and a pad layer on the buffer pad,
wherein the pad layer directly contacts a side surface of the pad pattern, and comprises a second conductivity type different from the first conductivity type,
wherein the buffer pad directly contacts the side surface of the pad pattern,
wherein the gate electrodes comprise an upper erase control gate electrode that is an uppermost one of the gate electrodes, and
wherein the upper erase control gate electrode overlaps the pad pattern, the pad layer, and the buffer pad in a second direction perpendicular to the first direction.

18. The semiconductor device of claim 17, wherein the buffer pad comprises a first portion between the channel layer and the pad layer, and a second portion on the first portion and between the pad layer and the core pattern.

19. The semiconductor device of claim 17,
wherein the gate electrodes comprise a lower erase control gate electrode that is in a lowermost portion of the gate electrodes,
wherein a side surface of the upper erase control gate electrode faces a side surface of the pad structure, and
wherein a side surface of the lower erase control gate electrode faces a side surface of the core pattern and a side surface of the channel layer.

20. The semiconductor device of claim 1, wherein a lower surface of the pad pattern directly contacts an upper surface of the core pattern.

* * * * *